US012306256B2

(12) United States Patent
Miranda et al.

(10) Patent No.: US 12,306,256 B2
(45) Date of Patent: May 20, 2025

(54) SENSOR WITH SELF SUPPLIED NEGATIVE RAIL FOR BATTERY PACK MEASUREMENT

(71) Applicant: Caterpillar Inc., Peoria, IL (US)

(72) Inventors: Jose D. Miranda, Peoria, IL (US); Jason Lee Miller, Princeville, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 17/859,193

(22) Filed: Jul. 7, 2022

(65) Prior Publication Data

US 2024/0012059 A1    Jan. 11, 2024

(51) Int. Cl.
*G01R 31/36* (2020.01)
*B60R 16/033* (2006.01)
(Continued)

(52) U.S. Cl.
CPC .......... *G01R 31/385* (2019.01); *B60R 16/033* (2013.01); *G01R 31/3644* (2013.01);
(Continued)

(58) Field of Classification Search
CPC . G01R 31/385; G01R 31/3644; H02M 3/071; B60R 16/033; H01M 10/425; H01M 10/482; H01M 2010/4271; H01M 2220/20
USPC .. 324/415, 437, 425–435, 126, 756.05, 538, 324/200, 233, 256, 500–530, 207.13, 324/76.11
See application file for complete search history.

(56) References Cited

U.S. PATENT DOCUMENTS

| 6,037,749 A | 3/2000 | Parsonage |
| 7,759,903 B2 | 7/2010 | Kamata |
| (Continued) |

FOREIGN PATENT DOCUMENTS

JP    2015014563 A    1/2015

OTHER PUBLICATIONS

Paxton Aaron et al: "Dual Bipolar Power-Supply Considerations for Amplifiers", TI Technotes, Aug. 1, 2017 (Aug. 1, 2017), pp. 1-3, XP093088035, Internet. Retrieved from the Internet: URL: https://www.ti.com/lit/an/sbva049/sbva, 049.pdf? ts=1696318072942&ref_url=https%3A%2F%2Fwww.google.com%2F, [retrieved on Oct. 3, 2023] the whole document].

(Continued)

*Primary Examiner* — Raul J Rios Russo
*Assistant Examiner* — Trung Q Nguyen
(74) *Attorney, Agent, or Firm* — Schwegman, Lundberg & Woessner (57) ABSTRACT

A battery management system configured to couple to at least one battery module, the battery management system includes a contact configured to couple between the at least one battery module and a machine, a sensor configured to sense an electrical parameter of the at least one battery module, and a control circuit configured to receive an output of the sensor and determine a value of the electrical parameter. The sensor includes an inverting charge pump coupled to receive a positive supply voltage and generate a negative supply voltage, and a differential amplifier coupled to the at least one battery module and supplied by the positive supply voltage and the negative supply voltage, the differential amplifier configured to generate an output representing the electrical parameter.

8 Claims, 5 Drawing Sheets

(51) Int. Cl.
  *G01R 31/385* (2019.01)
  *H01M 10/42* (2006.01)
  *H01M 10/48* (2006.01)
  *H02M 3/07* (2006.01)

(52) U.S. Cl.
  CPC ....... *H01M 10/425* (2013.01); *H01M 10/482* (2013.01); *H02M 3/071* (2021.05); *H01M 2010/4271* (2013.01); *H01M 2220/20* (2013.01)

(56) References Cited

U.S. PATENT DOCUMENTS

| | | | |
|---|---|---|---|
| 7,952,327 B2 | 5/2011 | Kudo et al. | |
| 8,742,834 B2 | 6/2014 | Motoki | |
| 9,647,537 B2 | 5/2017 | Ayel | |
| 11,942,815 B1* | 3/2024 | Bean | H02J 7/0047 |
| 11,964,586 B2* | 4/2024 | Kim | H01M 10/425 |
| 12,032,029 B2* | 7/2024 | Price | H01M 10/48 |
| 2008/0238527 A1* | 10/2008 | Bolz | H02J 7/0014 |
| | | | 307/10.6 |
| 2013/0195291 A1* | 8/2013 | Josefsson | H02M 1/12 |
| | | | 381/174 |
| 2015/0002195 A1* | 1/2015 | Englekirk | H02M 3/07 |
| | | | 327/157 |
| 2015/0070023 A1 | 3/2015 | Kudo et al. | |
| 2015/0196709 A1* | 7/2015 | Jacobson | A61M 5/142 |
| | | | 604/67 |
| 2015/0381035 A1* | 12/2015 | Torres | H02M 3/16 |
| | | | 327/536 |
| 2016/0054747 A1* | 2/2016 | Cohen | H02M 3/07 |
| | | | 713/300 |
| 2016/0126877 A1* | 5/2016 | Endoh | B62D 5/0409 |
| | | | 318/400.08 |
| 2016/0261127 A1* | 9/2016 | Worry | H02J 7/0029 |
| 2018/0212279 A1 | 7/2018 | Wang et al. | |
| 2023/0123946 A1* | 4/2023 | Mann | H02J 7/0068 |
| | | | 307/19 |

OTHER PUBLICATIONS

Texas Instruments: "TPS6040x Unregulated, 60-mA Charge Pump Voltage Inverter", Datasheet, Oct. 1, 2020 (Oct. 1, 2020), pp. 1-30, XP093087250, Internet. Retrieved from the Internet: URL:https://www.ti.com/lit/ds/symlink/tps6 0400.pdf? ts=l695925011229&ref_url=https%3A%2F%2Fwww.ti.com%2Fproduct%2FTPS60400%3Fke yMatch%3DTPS60400%26tisearch%3Dsearch-everything%26usecase%3DGPN, [Retrived on Sep. 29, 2023] Page 1.

Written Opinion and International Search Report for Int'l. Patent Appin. No. PCT/US2023/068656, mailed Oct. 12, 2023 (34 pgs).

* cited by examiner

SENSOR WITH SELF SUPPLIED NEGATIVE RAIL FOR BATTERY PACK MEASUREMENT

TECHNICAL FIELD

This document relates generally to a battery management system for an electrified machine and, in particular, to techniques for monitoring electrical parameters of batteries.

BACKGROUND

Sensors that use operational amplifiers or differential amplifiers in their design utilize a positive voltage supply (positive rail) and a negative voltage supply (negative rail) to be able to accurately output a true zero volts. For example, operational amplifiers have a voltage swing specification that defines how close an output voltage of the operational amplifier can approach a supply voltage. By way of specific example, for an operational amplifier supplied by a positive supply of +15V and a negative supply of −15V and having a 0.3V voltage swing, the output may reach +14.7V and −14.7V. However, for an operational amplifier supplied only by a positive supply of +15V (with the negative supply input of the operational amplifier tied to ground) and having a 0.3V voltage swing, the output may reach +0.3V and +14.7V. As such, it is impossible for an operational amplifier to output zero volts unless it is supplied by both positive and negative supplies. The negative supply is needed to force the output voltage toward the negative supply rail.

U.S. Pat. No. 7,952,327 describes an assembled battery total voltage detection and. leak detection apparatus which is reduced in size and is reduced in manufacturing costs. Detection of a total voltage is performed at a measurement time of a total voltage of an assembled battery by connecting an output of a positive electrode resistance voltage dividing circuit composed of resistors and to + input of a differential amplifier and connecting an output of a negative electrode resistance voltage dividing circuit composed of resistors and to − input of the amplifier, and it performs leak detection at a leak detection time by connecting an output of a positive electrode resistance voltage dividing circuit to + input of the amplifier and connecting + input of the amplifier to the minus input of the differential amplifier to measure an output voltage of the amplifier. The total voltage detection and the leak detection can be performed without requiring an insulation type voltage sensor, an insulation power source, photo-couplers, or the like.

SUMMARY OF THE INVENTION

By using various techniques of this disclosure, a sensor, such as part of a battery management system, may generate its own negative voltage supply such that operational amplifiers of the sensor may generate a true zero volt output using the negative voltage supply and an externally provided positive voltage supply.

In some aspects, this disclosure is directed to a battery management system configured to couple to at least one battery module, the battery management system comprising: a contact configured to couple between the at least one battery module and a machine; a sensor configured to sense an electrical parameter of the at least one battery module, the sensor comprising: an inverting charge pump coupled to receive a positive supply voltage and generate a negative supply voltage; and a differential amplifier coupled to the at least one battery module and supplied by the positive supply voltage and the negative supply voltage, the differential amplifier configured to generate an output representing the electrical parameter; and a control circuit configured to receive an output of the sensor and determine a value of the electrical parameter.

In some aspects, this disclosure is directed to a battery management system configured to couple to at least one battery module, the battery management system comprising: a first contact configured to couple between the at least one battery module and a machine; a resistor coupled in series with a second contact, wherein the resistor and the second contact are coupled in parallel with the first contact; a first sensor configured to sense a first electrical parameter of the at least one battery module, the first sensor comprising: an inverting charge pump coupled to receive a positive supply voltage and generate a first negative supply voltage; and a differential amplifier coupled to the at least one battery module and supplied by the positive supply voltage and the first negative supply voltage, the differential amplifier configured to generate an output representing the first electrical parameter; a second sensor coupled to a second side of the first contact, the second sensor configured to sense a second electrical parameter of the at least one battery module as seen by the machine, the second sensor comprising: an inverting charge pump coupled to receive a positive supply voltage and generate a second negative supply voltage; and a differential amplifier coupled to the at least one battery module and supplied by the positive supply voltage and the second negative supply voltage, the differential amplifier configured to generate an output representing the second electrical parameter; and a control circuit configured to receive corresponding outputs of the first sensor and second sensor and determine a value of the first electrical parameter and a value of the second electrical parameter.

In some aspects, this disclosure is directed to a sensor configured to sense an electrical parameter of at least one battery module, the sensor comprising: an inverting charge pump coupled to receive a positive supply voltage and generate a negative supply voltage; a differential amplifier coupled to the at least one battery module and supplied by the positive supply voltage and the negative supply voltage, the differential amplifier configured to generate an output representing the electrical parameter.

DETAILED DESCRIPTION

Examples according to this disclosure are directed to methods and systems for a sensor, such as part of a battery management system, that may generate its own negative voltage supply such that operational amplifiers of the sensor may generate a true zero volt output using the negative voltage supply and an externally provided positive voltage supply.

Electrified machines are powered by batteries instead of an engine. A battery pack may include one or more battery modules, and a battery module may include one or more battery cells. Battery modules may include a battery cell monitoring circuit to monitor, among other things, a voltage and a temperature of the battery cells in the battery module.

Electrified machines include a battery management system (BMS) to, among other things, monitor the status and health of the battery modules. The BMS may include an electronic control module (ECM) in communication with the various battery module monitoring circuits to receive and aggregate the information from the various battery modules. The ECM may coordinate operation of all the battery modules. The battery modules may be connected, such as in series and in parallel, with one another using high voltage, high current electrically controlled contacts of a contactor.

The battery module monitoring circuits may include sensors that use operational amplifiers or differential amplifiers in their design require a positive voltage supply (positive rail) and a negative voltage supply (negative rail) to be able to accurately output a true zero volts. For accuracy, it is desirable that the ECM know when a voltage of a battery module is actually zero volts. However, for sensors that include an operational amplifier supplied by a positive voltage supply with the negative voltage supply input of the operational amplifier tied to ground and having a voltage swing, it is impossible for the operational amplifier to output zero volts.

A negative voltage supply is used to force the output voltage of the operational amplifier toward the negative rail. If only a positive voltage supply is used, then inaccurate measurements may occur at high voltages. In addition, the ECM would not know if a voltage of a battery module is actually at zero volts or if the contacts of the contactor are open, for example. A negative rail is needed to provide a differential signal and output a true zero volts out of the amplifier.

The present inventors have recognized a need to provide a negative voltage supply to a sensor of a battery module monitoring circuit. The present inventors have also recognized that adding a negative voltage supply to the ECM would be too expensive. To solve the problem, the present inventors designed the sensor to generate a negative voltage supply, rather than be provided by the ECM to the sensor. The negative voltage supply may be used as the negative rail for the operational amplifiers and the differential amplifiers of the sensor.

Figure 1:
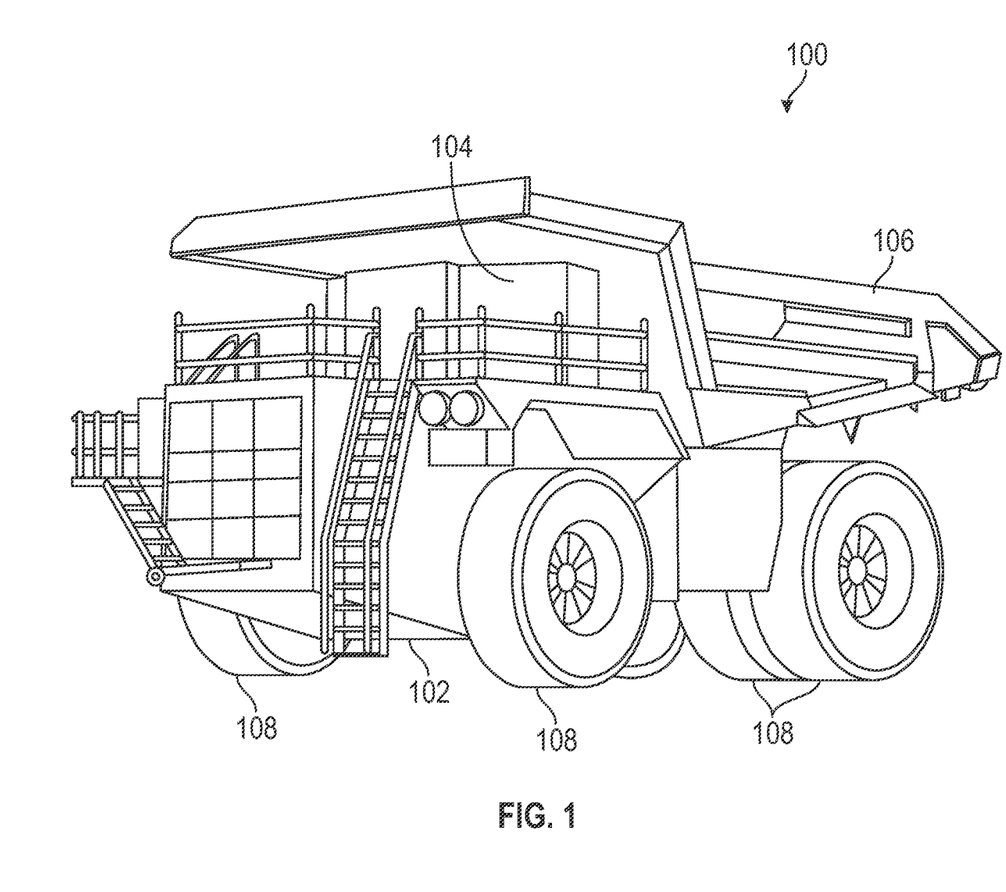
FIG. 1 is a perspective view of an example of an electrified machine that may implement various techniques of this disclosure.

FIG. 1 is a perspective view of an example of an electrified machine that may implement various techniques of this disclosure. A non-limiting example of an electrified machine 100 is shown in FIG. 1. The electrified machine 100 may be any machine or vehicle powered, at least partially, by batteries, as will be described below with reference to FIG. 2. The electrified machine 100 may be a mining truck, as depicted, or any other on-highway or off-highway machine or vehicle. In some examples, the electrified machine 100 may include a machine frame 102 supporting at least an operator control station 104 and a dump body 106. Ground-engaging elements 108, such as wheels and/or tires, may also be supported by the machine frame 102, and may be powered by a drive system, discussed below, supported by the machine frame 102.

Figure 2:
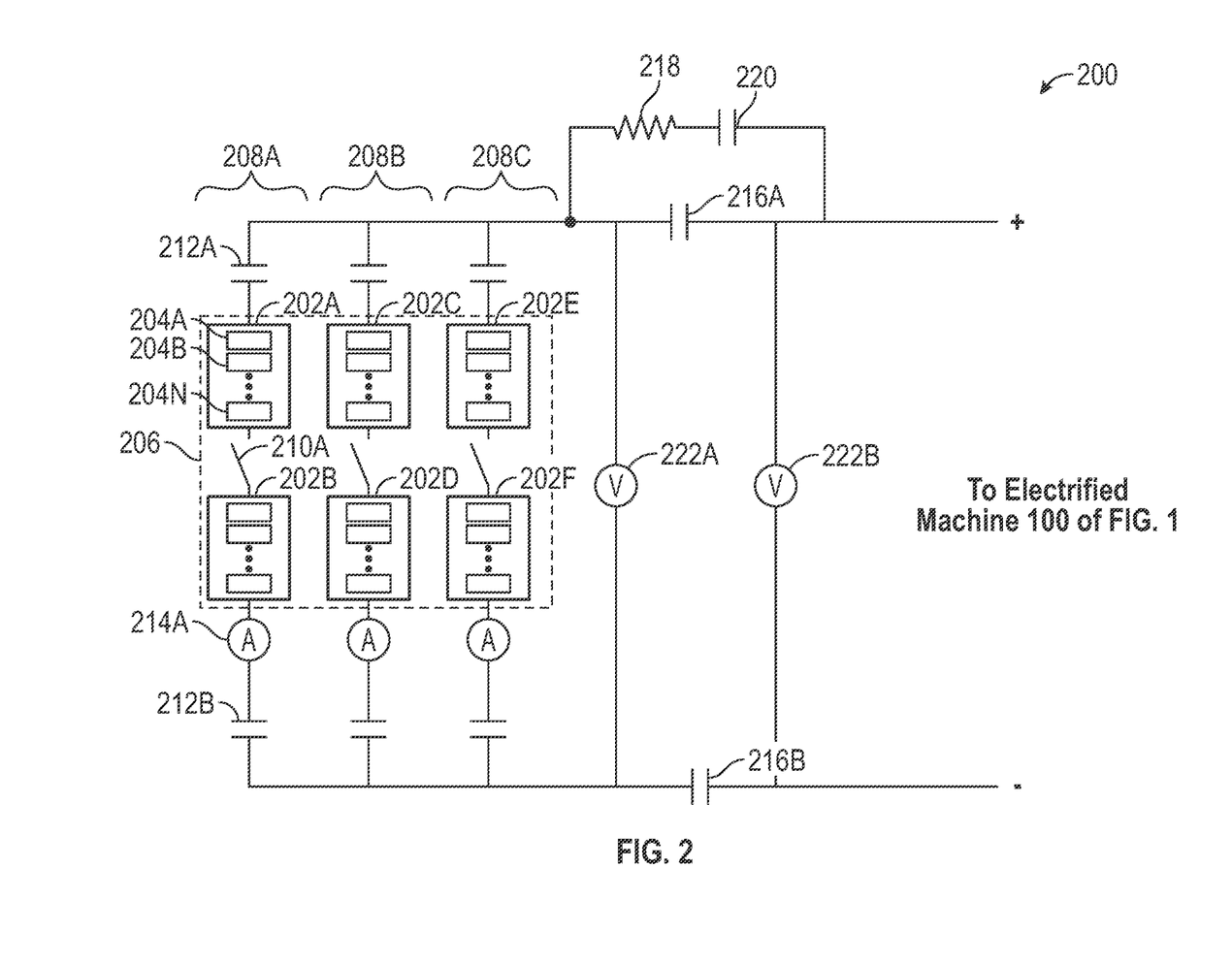
FIG. 2 is a simplified block diagram of an example of a portion of a battery management system that can implement various techniques of this disclosure.

FIG. 2 is a simplified block diagram of an example of a portion of a battery management system 200 that can implement various techniques of this disclosure. The battery management system 200 is configured to couple to at least one battery module 202A-202F. A battery module, such as the battery module 202A, may include one or more battery cells 204A-204N. Battery modules may be coupled together to form a battery pack. For example, the battery modules 202A-202F may be coupled together to form a battery pack 206.

The battery modules may be arranged in strings. For example, the battery modules 202A, 202B may be coupled in series to form a first string 208A. The battery modules 202C, 202D and the battery modules 202E. 202F may be similarly coupled to form a second string 208B and a third string 208C, respectively.

The strings may include a manual disconnect switch toward or at the middle of a string. For example, the string 208A may include a manual disconnect switch 210A between the battery module 202A and the battery module 202B.

In some examples, the strings may include a first contact 212A and a second contact 212B, where the first contact 212A and the second contact 212B are contact coupled between a battery module and the electrified machine. The first contact 212A and the second contact 212B may a machine part of a contactor that includes an operating coil and contacts that are actuated by when the operating coil is energized or deenergized. By including the first contact 212A and the second contact 212B, for example, the first string 208A may be isolated from the remaining strings 208B, 208C, such as during a fault condition.

In the example shown in FIG. 2, each string may include a current sensor, such as the current sensor 214 of the string 208A, to sense the current through the string. Although depicted as being located on the negative side of the string, the current sensor 214 may alternatively be located on the positive side of the string. In some examples, each string may include a fuse.

The strings 208A-208C may be coupled in parallel, such as to increase the capacity available to the electrified machine 100 of FIG. 1. A non-limiting list of examples of components that may be connected to the battery management system 200 of FIG. 2 and battery powered include a traction inverter, a hydraulic inverter, and an A/C compressor.

The battery management system 200 may be coupled to the electrified machine 100 via contacts 216A, 216B. In some examples, it may be desirable to include a resistor 218 coupled in series with a contact 220, where the resistor 218 and the contact 220 are coupled in parallel with the contact 216A. The resistor 218 may be a precharge resistor to control a flow of current from the battery modules 202A-202F.

The battery management system 200 may include a sensor 222A configured to sense a representation of an electrical parameter of the battery modules 202A-202F. The sensor 222A may be coupled to a first side of the contact 216A. For example, the sensor 222A may be a voltage sensor configured to sense a representation of a voltage across the battery pack 206. The sensor 222A may measure a voltage, for example, at the terminals of the battery pack 206.

In some examples, the battery management system 200 may include a sensor 222B configured to sense an electrical parameter of the battery modules 202A-202F. The sensor 222B may be coupled to a second side of the contact 216A and configured to sense the electrical parameter of the at least one battery module as seen by the machine. For example, the sensor 222B may be a voltage sensor configured to sense a voltage across the battery pack 206, as seen by the electrified machine 100 of FIG. 1. In some examples, the sensor 222B is used to determine a precharge level. Essentially, the battery management system 200 may monitor the battery side voltage with the sensor 222A, then during precharge, the sensor 222B may indicate how the machine side capacitance is charging. The battery management system 200 will not close the + main contactor until both voltages are within a certain voltage of each other.

As mentioned above, the present inventors have recognized a need to provide a negative voltage supply to a sensor of a battery module monitoring circuit. As described below with respect to FIGS. 3A-3C, the present inventors designed a sensor to generate a negative voltage supply, rather than be provided by an ECM to the sensor. The negative voltage supply may be used as the negative rail for the operational amplifiers and the differential amplifiers of the sensor.

Figure 3A:
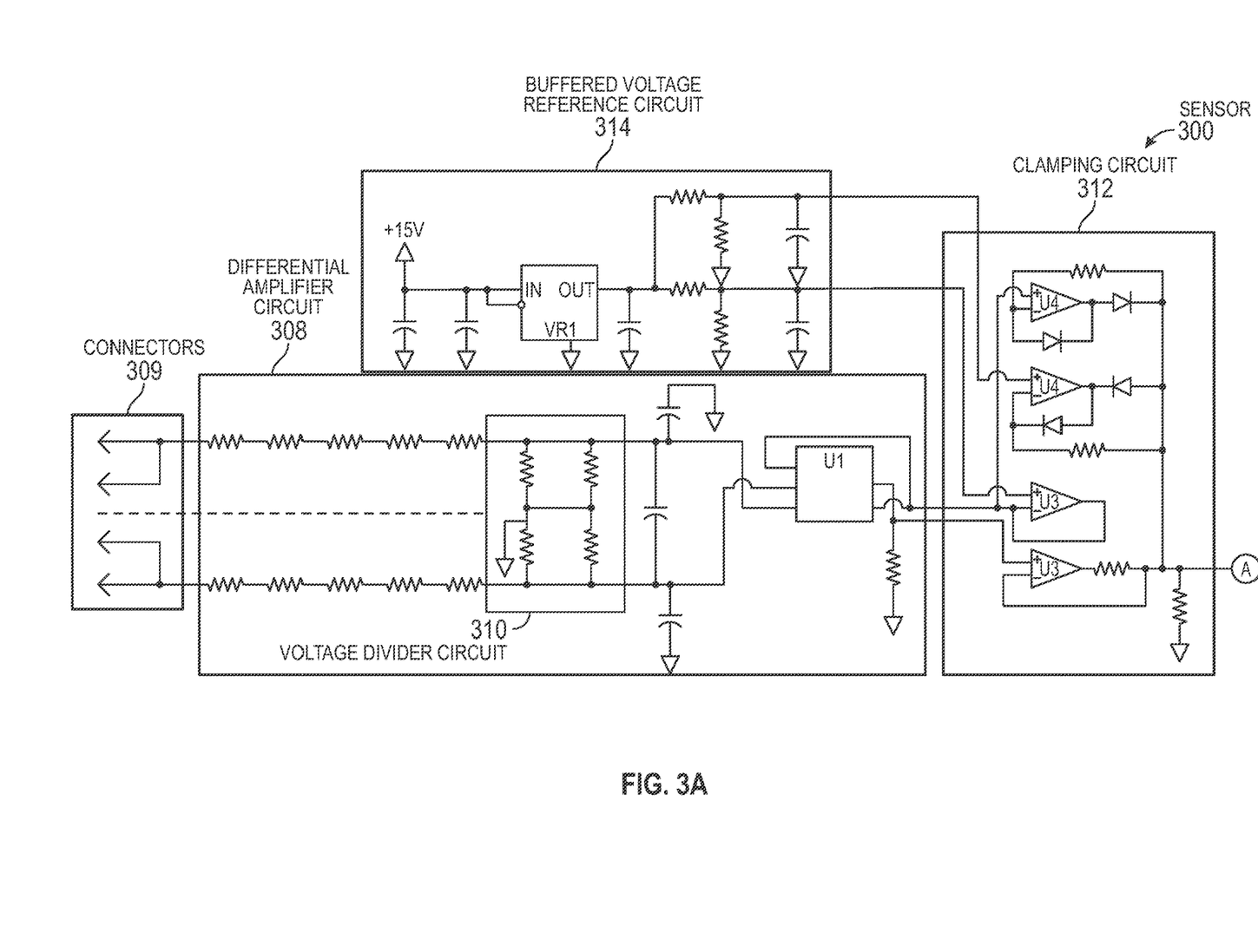
FIGS. 3A-3C depict a schematic diagram of an example of a sensor in accordance with this disclosure.
Figure 3B:
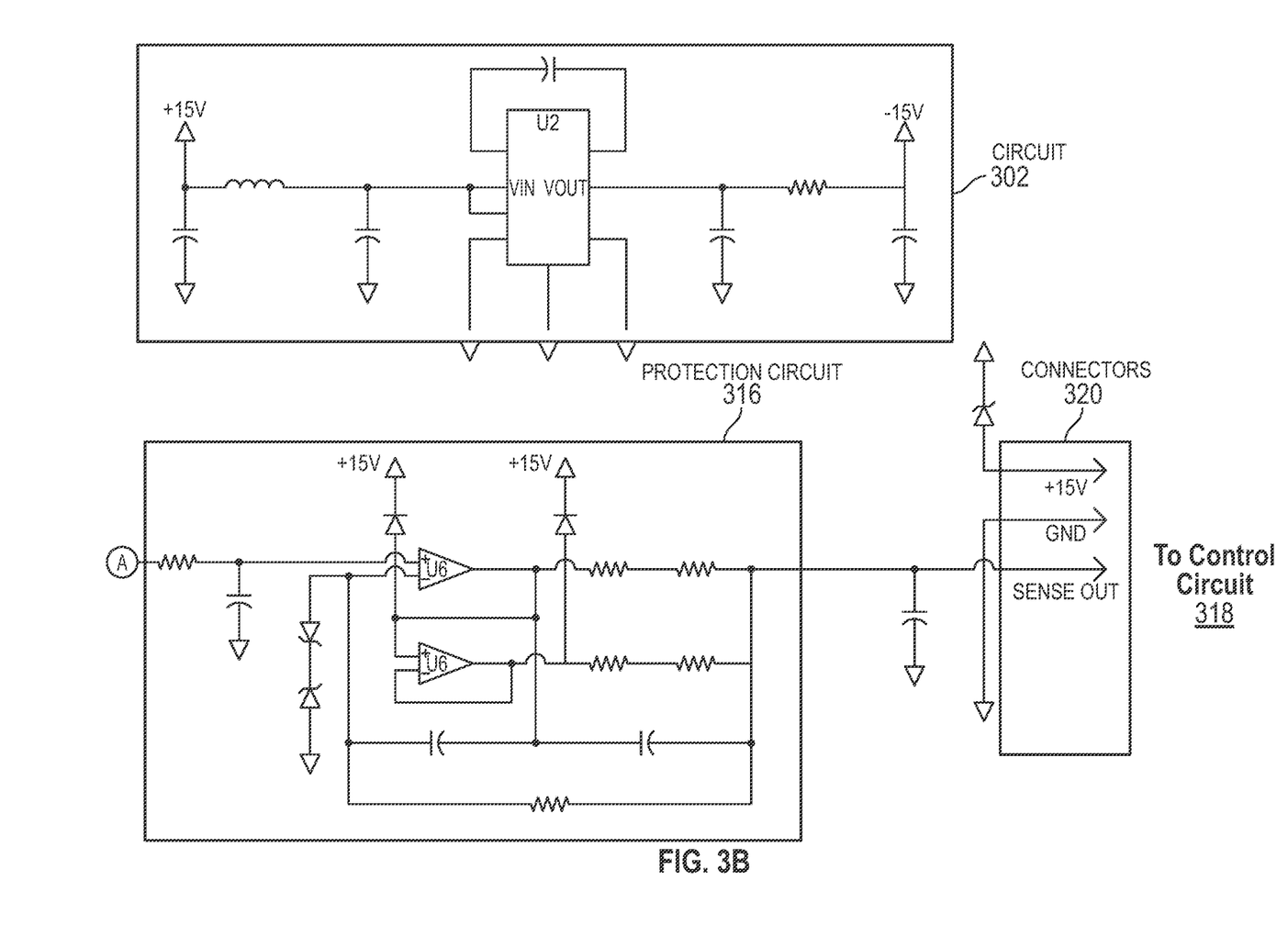
Figure 3C:
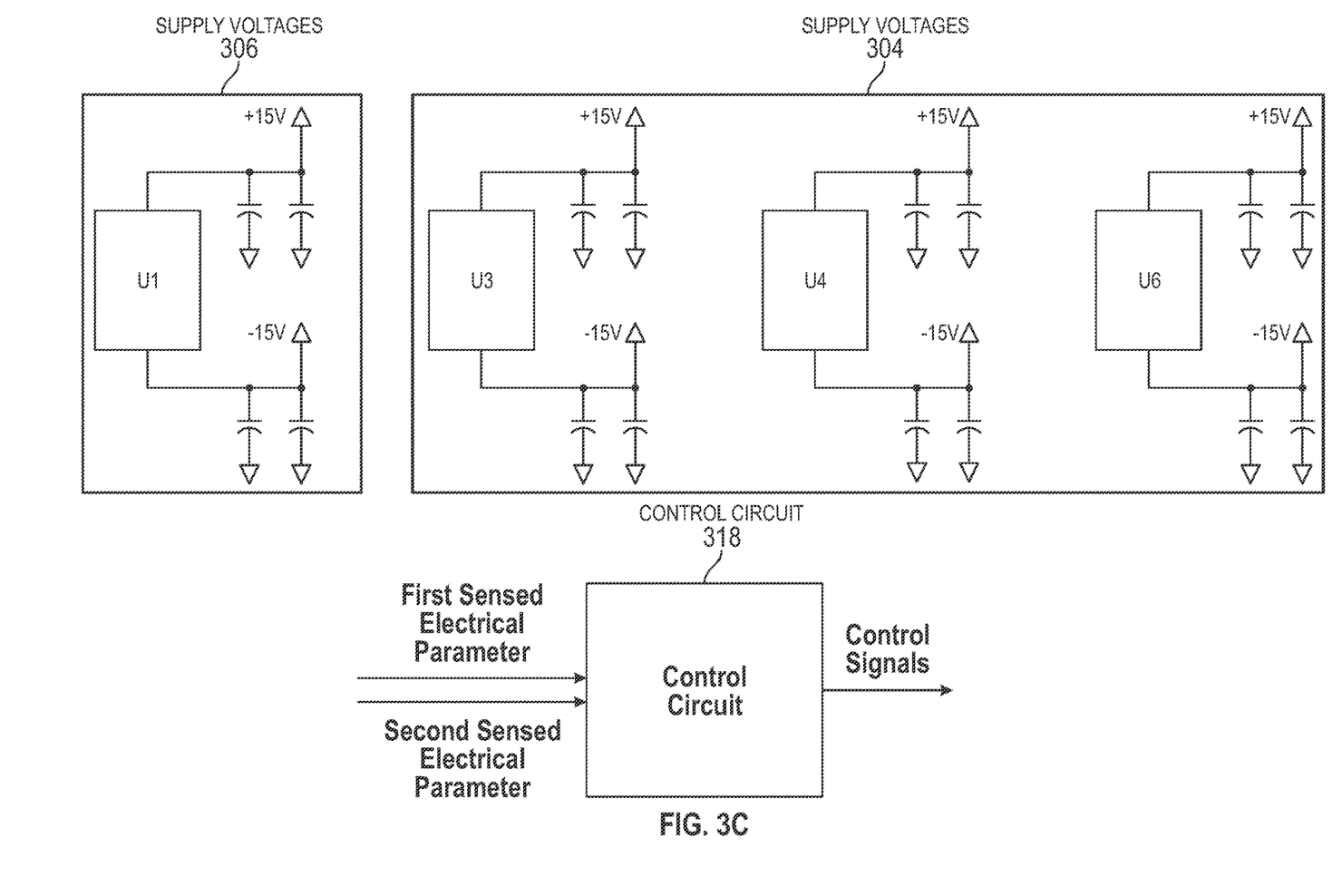

FIGS. 3A-3C depict a schematic diagram of an example of a sensor 300 in accordance with this disclosure. The sensor 300 is an example of the sensors 222A, 222B of FIG. 2. The sensor 300 may include an inverting charge pump circuit 302 including an inverting charge pump U2 including pins coupled to various components, as shown in FIG. 3B. As seen in FIG. 3B, the inverting charge pump 152 may be coupled to receive a positive supply voltage at VIN, such as +15V, and generate a negative supply voltage at VOUT, such as −15V. In this manner, the sensor 300 may generate the negative rail itself, rather than being supplied a negative rail via an external circuit, such as by the ECM.

Both the positive voltage supply and the negative supply voltage are used by the operational amplifier circuits and the differential amplifier circuits of the sensor 300 to provide a true zero output. The supply voltages are depicted at 304 for operational amplifiers U3, U4, and U6. Each of the operational amplifier circuits U3, U4, and U6 receive a positive supply voltage of +15V, and a negative supply voltage of −15V that is generated by the inverting charge pump circuit 302.

The supply voltages are depicted at 306 for a differential amplifier U1. The differential amplifier U1 receives a positive supply voltage of +15V, and a negative supply voltage of −15V that is generated by the inverting charge pump circuit 302. By using both a positive voltage supply and a negative voltage supply, the operational amplifiers and differential amplifier may accurately output a true zero volts and improve the accuracy of the sensor 300.

The sensor 300 further may further include a differential amplifier circuit 308 that includes the differential amplifier U1 coupled a voltage divider circuit 310. The differential amplifier circuit 308 may be coupled to the terminals of one or more battery modules, such as the battery modules 202A-202F in FIG. 2, via connectors 309. The voltage divider circuit 310 may be coupled between the terminals of the at least one battery module and the differential amplifier circuit. The differential amplifier U1 may be configured to generate an output representing an electrical parameter, such as a voltage, of the battery modules.

The output of the differential amplifier circuit 308 may be applied to a. clamping circuit 312 formed by the operational amplifiers U3 and U4, where the clamping circuit 312 is configured to clamp the output of the differential amplifier. The clamping circuit 312 is supplied by the positive supply voltage and the negative supply voltage. The operational amplifiers U3 and U4 may be coupled to receive a reference voltage from a buffered voltage reference circuit 314 that may include a buffered voltage reference VR1 coupled to various components.

In some examples, the sensor 300 may include a protection circuit 316. The protection circuit 316 may include the operational amplifier U6 coupled to various components.

The output of the sensor may be provided to a control circuit 318 via one or more connectors 320. The control circuit 318 may be configured to receive an output of the sensor and determine a value of an electrical parameter, such as a voltage. For example, a voltage of at least one battery module sensed by the sensor 300 may be provided to the control circuit 318. Among other things, the control circuit 318 may determine that a voltage of one or more of the battery modules 202A-202F of FIG. 2 is too low and that the battery modules should be recharged. Or, the control circuit 318 may determine that a fault condition exists and that one or more contacts, such as contacts 212A, 212B of FIG. 2, should be opened to isolate one string, such as the string 208A, from the other strings.

As seen in FIG. 3C, the control circuit 318 may receive a first sensed electrical parameter and, in some examples, a second (or even more) sensed electrical parameters. For example, the battery management system 200 of FIG. 2 includes two sensors 222A, 222B. Each sensor may be similar to the sensor 300 of FIG. 3A-3C and output a sensed electrical parameter to the control circuit 318.

Industrial Applicability

Sensors that use operational amplifiers or differential amplifiers in their design require a positive voltage supply (positive rail) and a negative voltage supply (negative rail) to be able to accurately output a true zero volts. It may be costly to externally provide both a positive voltage supply and a negative voltage supply to the sensor.

This disclosure pertains to a sensor for a battery management system. By using various techniques of this disclosure, the sensor may generate its own negative voltage supply such that operational amplifiers of the sensor may generate a true zero volt output using the negative voltage supply and an externally provided positive voltage supply.

The above detailed description is intended to be illustrative, and not restrictive. The scope of the disclosure should, therefore, be determined with references to the appended claims, along with the full scope of equivalents to which such claims are entitled.

What is claimed is:

1. A battery management system configured to couple to at least one battery module, the battery management system comprising:
    a first sensor including a voltage divider circuit and configured to sense a first voltage of the at least one battery module, the first sensor comprising:
        an inverting charge pump coupled to receive a positive supply voltage and generate a first negative supply voltage; and
        a differential amplifier coupled to the at least one battery module and supplied by the positive supply voltage and the first negative supply voltage generated by the inverting charge pump, the differential amplifier configured to generate an output representing the first voltage; and
    a second sensor configured to sense a second voltage of the at least one battery module as seen by the machine, the second sensor comprising:
        an inverting charge pump coupled to receive the positive supply voltage and generate a second negative supply voltage; and
        a differential amplifier coupled to the at least one battery module and supplied by the positive supply voltage and the second negative supply voltage, the differential amplifier configured to generate an output representing the second voltage; and a control circuit configured to receive corresponding outputs of the first sensor and second sensor and determine a value of the first voltage and a value of the second voltage.

2. The battery management system of claim 1, wherein the voltage divider circuit is coupled between terminals of the at least one battery module and the differential amplifier.

3. The battery management system of claim 1, wherein the sensor further comprises:
   a clamping circuit supplied by the positive supply voltage and the negative supply voltage, wherein the clamping circuit is configured to clamp the output of the differential amplifier.

4. The battery management system of claim 1, comprising:
   a plurality of battery modules coupled together to form a battery pack, wherein the sensor is configured to sense the electrical parameter of the battery pack.

5. A battery management system configured to couple to at least one battery module, the battery management system comprising:
   a first contact configured to couple between the at least one battery module and a machine;
   a resistor coupled in series with a second contact, wherein the resistor and the second contact are coupled in parallel with the first contact;
   a first sensor configured to sense a first electrical parameter of the at least one battery module, the first sensor comprising:
   an inverting charge pump coupled to receive a positive supply voltage and generate a first negative supply voltage; and
   a differential amplifier coupled to the at least one battery module and supplied by the positive supply voltage and the first negative supply voltage, the differential amplifier configured to generate an output representing the first electrical parameter;
   a second sensor coupled to a second side of the first contact, the second sensor configured to sense a second electrical parameter of the at least one battery module as seen by the machine, the second sensor comprising:
   an inverting charge pump coupled to receive a positive supply voltage and generate a second negative supply voltage; and
   a differential amplifier coupled to the at least one battery module and supplied by the positive supply voltage and the second negative supply voltage, the differential amplifier configured to generate an output representing the second electrical parameter; and
   a control circuit configured to receive corresponding outputs of the first sensor and second sensor and determine a value of the first electrical parameter and a value of the second electrical parameter.

6. The battery management system of claim 5, wherein the first electrical parameter and the second electrical parameter of the at least one battery module are voltages.

7. The battery management system of claim 6, wherein the first sensor further comprises:
   a voltage divider circuit coupled between terminals of the at least one battery module and the differential amplifier.

8. The battery management system of claim 6, wherein the first sensor further comprises:
   a clamping circuit supplied by the positive supply voltage and the negative supply voltage, wherein the clamping circuit is configured to clamp the output of the differential amplifier.

* * * * *